(12) United States Patent
Neidich et al.

(10) Patent No.: US 6,176,707 B1
(45) Date of Patent: Jan. 23, 2001

(54) INTERPOSER ASSEMBLY

(75) Inventors: Douglas A. Neidich, Harrisburg; John D. Walden, Mechanicsburg, both of PA (US)

(73) Assignee: InterCon Systems, Inc., Harrisburg, PA (US)

( * ) Notice: Under 35 U.S.C. 154(b), the term of this patent shall be extended for 0 days.

(21) Appl. No.: 09/455,989

(22) Filed: Dec. 7, 1999

Related U.S. Application Data

(63) Continuation of application No. 09/287,896, filed on Apr. 7, 1999, which is a continuation-in-part of application No. 08/960,953, filed on Oct. 30, 1997, now abandoned.

(51) Int. Cl.[7] ................................................. H01R 12/00
(52) U.S. Cl. ............................................. 439/66; 439/591
(58) Field of Search ................................ 439/66, 68, 591, 439/71

(56) References Cited

U.S. PATENT DOCUMENTS

| | | |
|---|---|---|
| 4,114,975 | 9/1978 | Weidler .......................... 339/176 M |
| 4,906,194 | 3/1990 | Grabbe ................................... 439/71 |
| 4,927,369 | 5/1990 | Grabbe et al. ......................... 439/66 |
| 4,969,826 | 11/1990 | Grabbe ................................... 439/66 |
| 4,998,886 | 3/1991 | Werner .................................. 439/66 |
| 5,137,456 | 8/1992 | Desai et al. ............................ 439/66 |
| 5,199,889 | 4/1993 | McDevitt, Jr. ......................... 439/66 |
| 5,308,252 | 5/1994 | Mroczkowski et al. ............... 439/66 |
| 5,324,205 | 6/1994 | Ahmad et al. ......................... 439/66 |
| 5,338,232 | 8/1994 | Bernier ................................ 439/733 |
| 5,342,205 | 8/1994 | Hashiguchi ............................ 439/66 |
| 5,437,556 | 8/1995 | Bargain et al. ........................ 439/66 |
| 5,573,435 | 11/1996 | Grabbe et al. ....................... 439/862 |
| 5,653,598 | 8/1997 | Grabbe ................................... 439/66 |
| 5,805,419 | 9/1998 | Hundt et al. ......................... 361/719 |
| 5,913,687 | 7/1999 | Rathburn ............................... 439/66 |
| 5,938,451 | 8/1999 | Rathburn ............................... 439/66 |

*Primary Examiner*—Renee Luebke
*Assistant Examiner*—Briggitte R. Hammond
(74) *Attorney, Agent, or Firm*—Thomas Hooker, P.C.

(57) ABSTRACT

An interposer assembly includes an insulating plate with passages extending through the thickness of the plate and metal contacts loosely confined in the passages. The contacts include noses that project outwardly from the plate for engagement with contact pads on overlying and underlying circuit members.

35 Claims, 6 Drawing Sheets

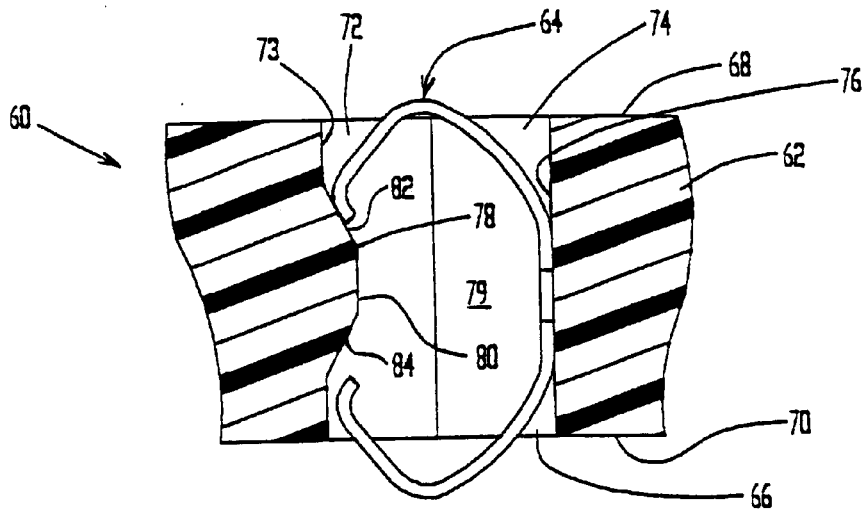
F I G. 7
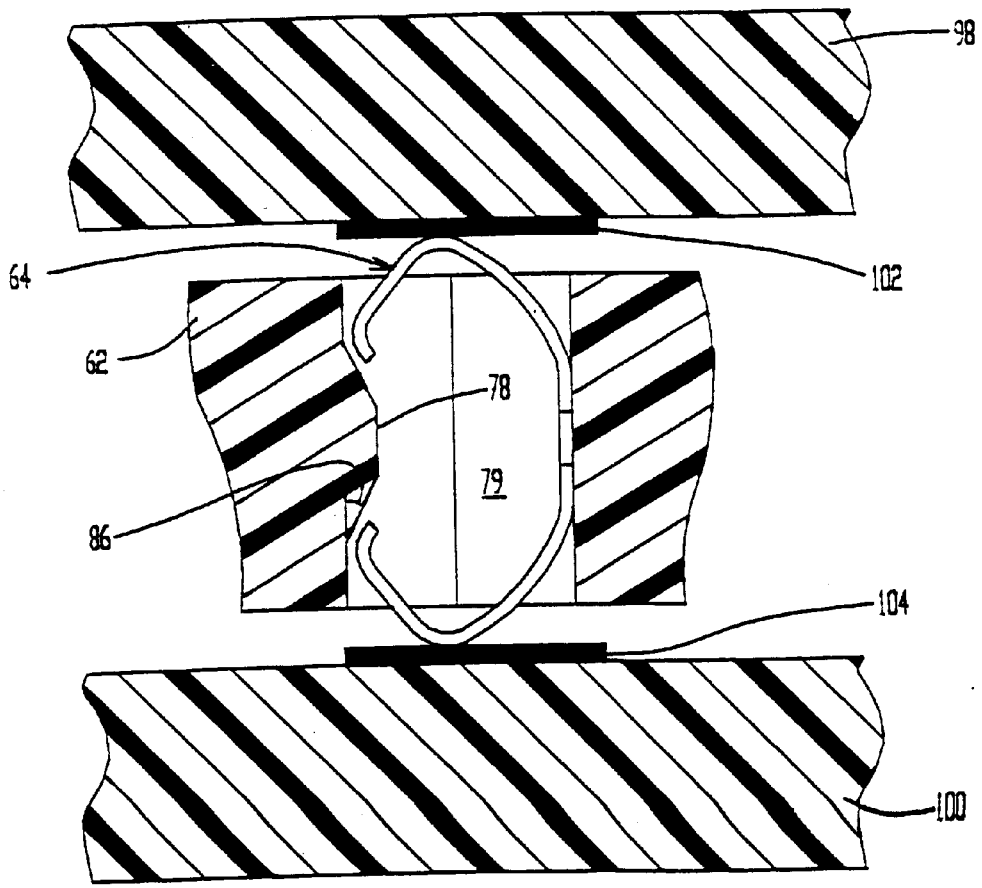
F I G. 8

INTERPOSER ASSEMBLY

This application is a continuation of our application Ser. No. 09/287,896 filed Apr. 7, 1999 which is a continuation-in-part of our now-abandoned application Ser. No. 08/960,953 filed Oct. 30, 1997.

FIELD OF THE INVENTION

The invention relates to interposer assemblies used for forming electrical connections between spaced contact pads on circuit members.

DESCRIPTION OF THE PRIOR ART

Interposer assemblies are used for forming electrical connections between densely spaced contact pads on adjacent parallel circuit members. The pads on the members are arranged in identical patterns. Commonly, the circuit members are a circuit board and a ceramic plate carrying integrated circuits. The interposer assembly includes an insulating plate and a plurality of through-contacts carried in the plate and arranged in the same pattern as the pads on the circuit members. The contacts project above the top and bottom sides of the plate. The interposer assembly is sandwiched between the two members which are held together with the contacts forming electric connections between aligned pairs of pads.

Interposer assemblies form electrical connections between contact pads arranged in a very close proximity to each other. The pads may be arranged on a one millimeter center-to-center grid. Each assembly may have as many as 961 contacts. Four assemblies are conventionally mounted on a single frame with a total of 3,844 contacts in the frame. In addition to requiring contacts which can be spaced very close to each other, the contacts must make reliable electrical connections with the pads when the assemblies are sandwiched between the circuit members. Failure of a single contact to make a reliable connection renders the entire frame useless.

A low mechanical closure force is required in order to prevent undue stress on a ceramic circuit member. A high closure force could distort or possibly break the ceramic member. Further, interposer assemblies must occupy a minimum width between the circuit members, requiring that the individual electrical contacts in the assembly have a limited height yet possess the required spring properties for establishing reliable electrical connections between the pads without undue closing force.

Conventional interposer assemblies use contacts which occupy a relatively large amount of space in the supporting plate making it difficult to meet closely spaced grid requirements. These assemblies are relatively expensive to manufacture and assemble.

SUMMARY OF THE INVENTION

The invention is an improved interposer assembly including metal through contacts loosely confined in closely spaced passages extending through an insulating plate. The contacts include arcuate portions which when compressed are elastically bent to form wiped pressure connections with opposed pads and reduce the force necessary to sandwich the interposer assembly between the circuit members. The low closure force reduces the risk of damage to an overlying ceramic substrate and allows a large number of contacts in the assembly. The wiped electrical connections between the contacts and the circuit pads form reliable electrical connections between the adjacent pairs of pads and permit installation of the interposer assemblies in user's facilities. The assemblies need not be installed in clean rooms.

The disclosed interposer assemblies use plates and contacts which are easily and inexpensively manufactured and assembled. The plate is a one-piece design and includes through passages with contact retention projections extending into the passages. The arcuate contacts are readily inserted into the passages to snap or latch over the projections, which then hold the contacts loosely in place in the passages prior to sandwiching of the assemblies between circuit members. The contacts are compact, permitting use of the assembly to form electrical connections between very closely spaced contact pads.

In a first embodiment each contact retention projection includes a sloped cam surface facing one side of the plate. The through contacts are inserted into the plate from the side adjacent the cam surfaces. During insertion, cam followers on the lead ends of the contacts engage the cam surfaces and are guided over the retention projections. When fully inserted, the contacts are held in the passages by the retention projections which extend between the free ends of the contacts. The contacts are loosely held in the passages with opposed contact noses spaced apart a distance greater than the thickness of the plate. When compressed, the contacts establish reliable wiped contacts with opposed pads.

In a second embodiment sloped cam surfaces are provided on both sides of the projection. The arcuate through contacts may be inserted from either side of the plate. During insertion, cam followers on the lead ends of the contacts engage cam surfaces and are guided past the projections which then hold the contacts in place. The contact noses are spaced apart a distance greater than the thickness of the plate to form wiped pressure contacts with opposing pads.

When a contact is positioned in a through passage in the second embodiment, rounded surfaces at the free ends of the contact are located adjacent the cam surfaces on opposite sides of the projection. The cam surfaces hold the contact loosely within the passage for floating engagement with opposed contact pads and formation of reliable wiped pressure connections with the pads.

The free ends of the contacts are held within the thickness of the plate to limit contact float. The sloped cam surfaces extend to the adjacent walls of the contact passages and assure that during insertion of the contacts into the passages the lead ends of the contacts are guided smoothly over the projections and do not hang up in the corners or junctions between the projections and the adjacent walls. On rare occasions, contacts inserted into the passages in the first embodiment interposer assembly catch in the corners and have been permanently shortened, destroying their ability to form connections between pads.

Other objects and features of the invention will become apparent as the description proceeds, especially when taken in conjunction with the accompanying drawings illustrating the invention, of which there are six sheets of drawings and two embodiments are disclosed.

DESCRIPTION OF THE DRAWINGS

FIG. 7 is a sectional view of the second embodiment like FIG. 2;

FIG. 8 is a sectional view illustrating the position of the assembly of FIG. 7 between two circuit members;

DESCRIPTION OF THE PREFERRED EMBODIMENTS

Figure 1:
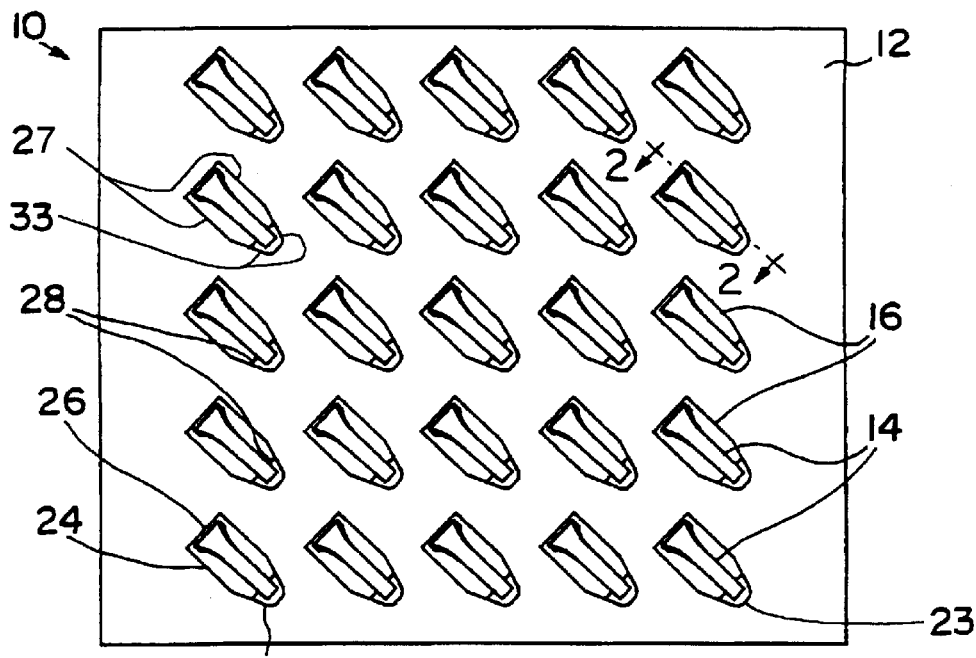
FIG. 1 is a top view of a first embodiment interposer assembly per the invention.

First embodiment interposer assembly 10 includes a flat plate 12 formed of insulating material with a plurality of metal through contacts 14 positioned in contact passages 16 extending through the thickness of the plate between opposed plate top and bottom sides 18 and 20. One contact 14 is positioned in each passage 16. A shown in FIGS. 1 and 2, passages 16 are each provided with a reduced width portion 22 and a uniform width portion 24 away from portion 22. Opposed parallel side walls 27 join end wall 26 and extend along portion 24 to opposed converging side walls 33. Walls 33 extend along portions 22 to end walls 23. Flat end wall 26 extends across the uniform width portion 24 and is located opposite reduced width end wall 23. Wall 23 extends across the reduced width portion.

Contact retention projections 28 are provided in the reduced width portions 22 of passages 16. Projections 28 extend from walls 23 a distance into the passages and narrow the passages at portions 29 between the projections and end walls 26. Narrow portion 29 extends from projection free end 31 to wall 26. The projections include contact retention surfaces 30 and 32 facing plate sides 18 and 20, respectively. The surfaces 30 and 32 are spaced in from the top and bottom sides of the plate. A sloped cam surface 34 extends from each retention surface 30 to the free end 31 of the projection 28 and faces top side 18. Surface 34 facilitates insertion of a contact 14 into passage 16.

Figure 5:
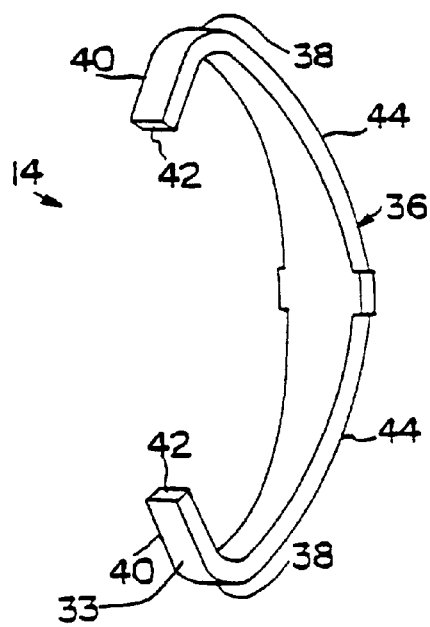
FIG. 5 is a perspective view of the contact shown in the assembly of FIG. 1.

Each metal contact 14 is preferably formed from uniform thickness strip stock, which may be suitably plated beryllium copper. The contact is generally D-shaped and includes a arcuate, convex spring 36 with a pair of opposed contact noses or pad contacts 38 at the ends of the spring. The center of spring 36 extends through narrow passage portion 29. The noses are spaced apart a distance greater than the thickness of the plate 12. Short retention legs 40 extend inwardly from the noses to free ends 42. The legs 40 extend away from spring 36 so that the noses 38 are located between the free ends 42 and the spring. As illustrated in FIG. 5, spring 36 has a maximum width at the center, midway between noses 38 and includes two tapered width spring arms 44 each extending from the center of the spring to a nose 38, in order to reduce stress concentration when the spring is stressed.

Passages 16 have a uniform transverse cross section, with the exception of projections 28. The interior surfaces defining end walls 26, side walls 27 and 33 and end walls 23 all extend perpendicularly to top and bottom sides 18 and 20. The major transverse width of passages 16 between walls 23 and 26 is approximately two times the minor transverse width of the passages at uniform width portion 24.

A single contact 14 is located in each passage 16 and extends across the major transverse width of the passage. See FIG. 2. With the contacts 14 in passages 16, contact noses 38 on both ends of the contacts are located in regularly spaced perpendicular rows for forming electrical connections with corresponding pads on circuit elements to either side of the plate. See FIG. 1.

Figure 2:
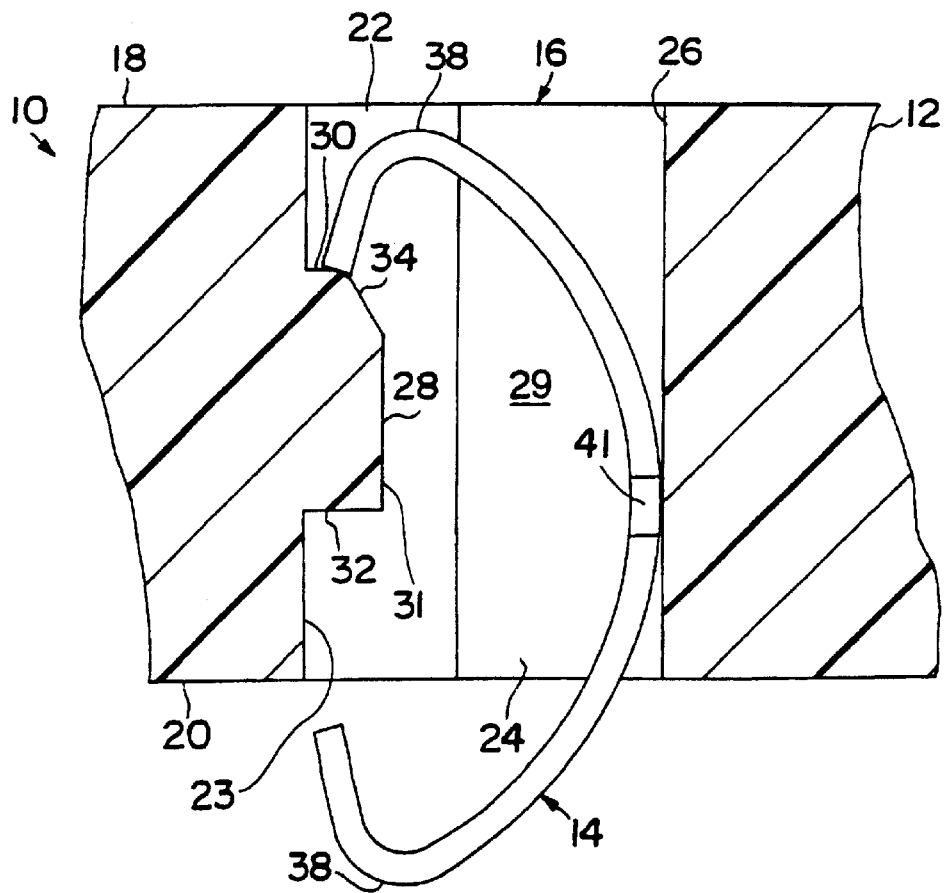
FIG. 2 is a sectional view taken along line 2—2 of FIG. 1.
Figure 6:
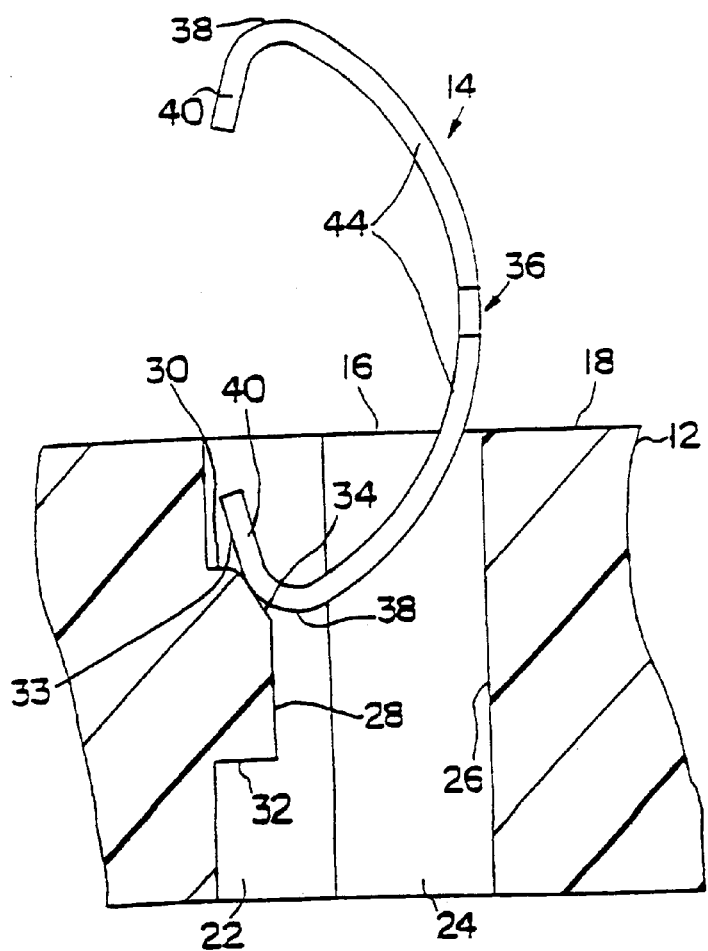
FIG. 6 is a sectional view illustrating insertion of the contact member of FIG. 5 into a passage extending through the plate.

Contacts 14 are inserted into passages 16 as shown in FIG. 6. One nose of the contact is extended into the end of the passage opening at plate top side 18 and is positioned in narrowed portion 29 between the projection 28 and wall 26. As contact 14 is inserted into the passage surface 33 the lower leg 40 serves as a cam follower and is guided by cam surface 34 to the end of the projection. Spring 36 engages wall 26. The contact is then inserted further into the passage with the result that the lower spring arm 44 is elastically stressed, leg 40 is moved past projection 28 and through narrowed portion 29 and snaps back under retention surface 32 of projection 28. With the contact inserted in passage 16 end 42 of the upper retention leg 40 is above the upper retention surface 30, end 42 of the lower retention leg 40 is located below the lower retention surface 32 and the center 41 of the arcuate spring is adjacent the flat wall 26. Spring 36 is bowed toward wall 26. The contact is loosely held in the passage between wall 23 and end wall 26 and with the projection between the ends 42 of the contact spring 36 at passage portion 29. The distance between the free ends 42 of legs 40 is greater than the height of projection 28, permitting limited free or float movement of the contact in passage 16. FIG. 2 illustrates the position of the contact in the passage when plate 12 is horizontal and the loose contact 14 is supported in the cavity against gravity with the end of the upper leg 40 resting on upper retention surface 30 of projection 28.

As illustrated in FIG. 1, the passages 16 are arranged close to each other in a dense array on plate 12 in order to permit forming electrical connections between similar arrays of contact pads on circuit elements located above and below the assembly. Conventionally, assembly 10 is used for forming electrical connections between contact pads on a ceramic integrated circuit and contact pads of a circuit board. The assembly may be used for forming electrical connections between contact pads on two circuit boards or between contact pads on other types of circuit members.

Figure 3:
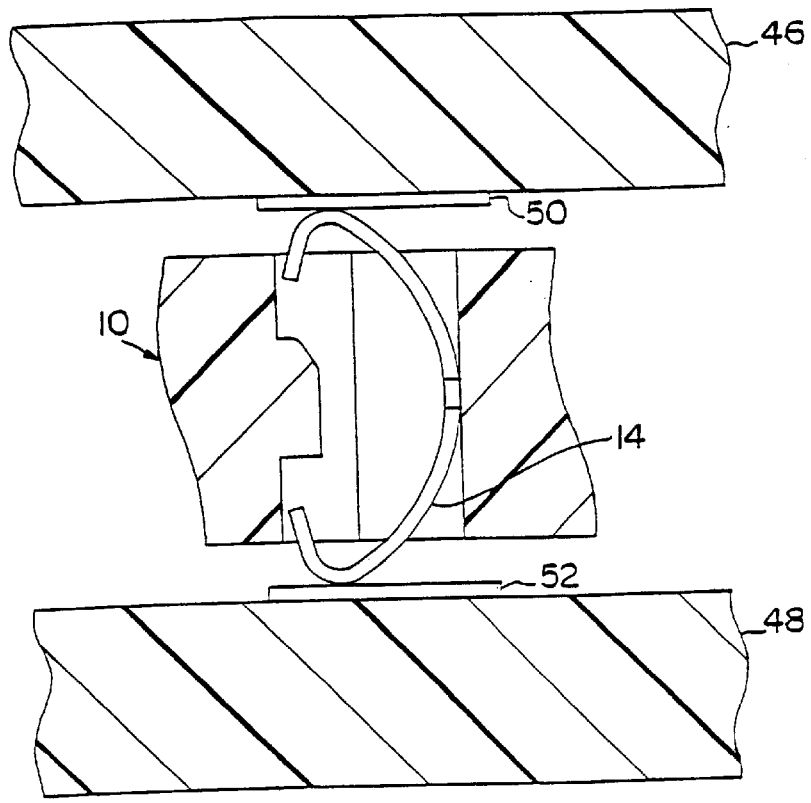
FIG. 3 is a sectional view illustrating the position of the assembly of FIG. 1 between two circuit members.

FIG. 3 illustrates the interposer assembly 10 positioned between upper and lower circuit members 46 and 48 with contact pads 50 and 52 on the members located above and below each contact in the assembly. The contacts lightly engage the pads and are not stressed.

Figure 4:
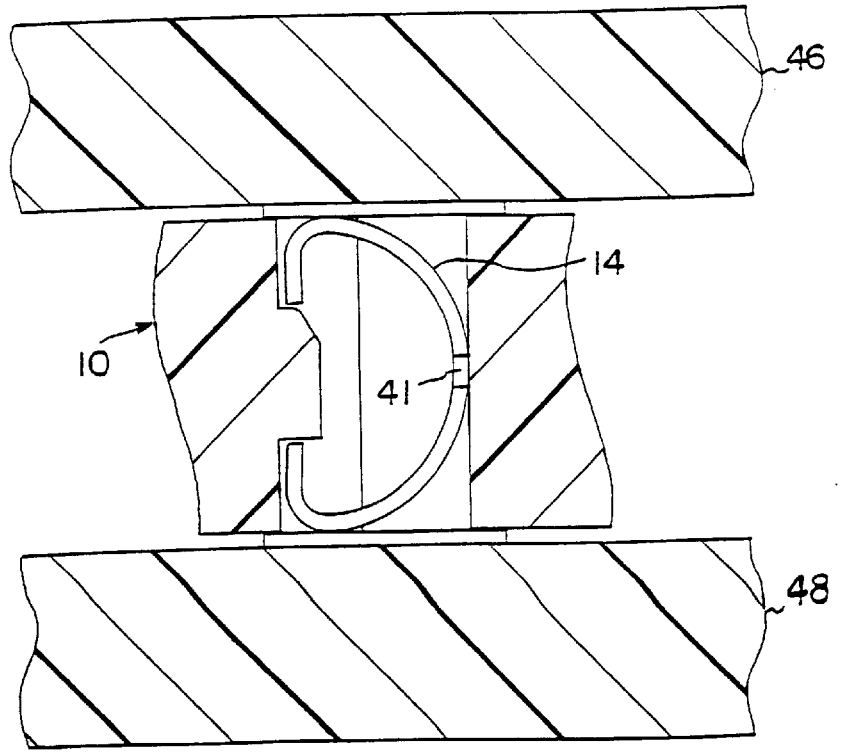
FIG. 4 is a view like FIG. 3 showing the assembly sandwiched between the circuit members.

FIG. 4 illustrates the assembly 10 when fully sandwiched between members 46 and 48 with the members held tightly against the plate 12. When the members are brought into contact with the assembly 10 the two contact pads 50 and 52 are moved together to reduce the height of contacts 14 and elastically bend the two tapered spring arms 44 of arcuate spring 36. The center of the spring engages the end wall 26 as shown in FIG. 4. Bending of the arcuate spring and foreshortening of the contact moves or wipes the contact noses 38 a distance along the contact pads toward wall 23 to make clean, low resistance pressure electrical connections between the contact noses 38 and the pads 50 and 52. The connections assure that the contact 14 provides a reliable, low resistance electrical path between the pads.

As illustrated in FIG. 4, foreshortening of contact 14 moves the free ends 42 of retention legs 40 together and brings the ends in close proximity to the retention surfaces 30 and 32 of projection 28. The retention legs do not engage the projection. Contact pressure is maintained by elastic bending of the spring 36 25 without bottoming of the ends of the contact on the projection or the walls of passage 16 which could undesirably increase the closing force.

FIGS. 7–12 illustrate a second embodiment interposer assembly 60. Interposer assembly 60 includes a flat plate 62 formed of insulating material with a plurality of metal through contacts 64 positioned in contact passages 66 extending through the thickness of the plate between opposed plate top and bottom sides 68 and 70. As shown in FIG. 7, passages 66 are each provided with a reduced width portion 72, like passage portion 22 in the plate 12 passages, and a uniform width portion 74 away from portion 72. Flat end wall 76 extends across the uniform width portion 74 and is located opposite reduced width end wall 73. Wall 73 extends across the reduced width portion.

Contact retention projections 78 are provided in the reduced width portions 72 of passages 66. Projections 78 extend a distance into the passages and narrow the passages at portions 79 between the projections and walls 76. Each projection 78 extends from portion 72 to an inner free end 80 spaced from wall 76 and facing the narrowed passage portion 79. The projections 78 are centered in the passages 66 between the top and bottom sides of the plate.

The projections 78 include sloped upper and lower cam surfaces 82 and 84 facing plate top and bottom 68 and 70, respectively. The cam surfaces 82 and 84 are spaced in from the top and bottom sides of the plate. Each upper cam surface 82 faces top side 68 and extends from wall 73 towards bottom side 70 to the inner end 80. Each lower cam surface 84 faces bottom side 70 and extends from wall 73 towards top side 68 to the inner end 80. As shown in FIG. 8, the upper and lower cam surfaces 82 and 84 are smooth, generally planar and slope at an angle 86 with respect to the axis of passage 66. Angle 86 is preferably about 25 degrees. Cam surfaces 82 and 84 facilitate insertion of contact 64 into passage 66 from either the top or bottom side of plate 62.

The contact 64 is arcuate and includes a flat central spine 88 and upper and lower tapered spring arms 90 extending from the ends of spine 88. Curved contact noses or pad contacts 92 are provided on the outer ends of arms 90. Retention legs 94 extend inwardly from the noses to rounded free ends 96. The contact noses 92 are spaced apart a distance greater than the thickness of the plate 62. The legs 94 extend away from spine 88 so that the noses 92 are located between the ends 96 and the spine.

Each metal contact 64 is preferably formed from the same stock as metal contacts 14. The through contacts 14 used in first embodiment assembly 10 and through contacts 64 used in the second embodiment assembly 60 are each bent from identical flat preforms punched from thin strip metal stock, as previously described.

Figure 12:
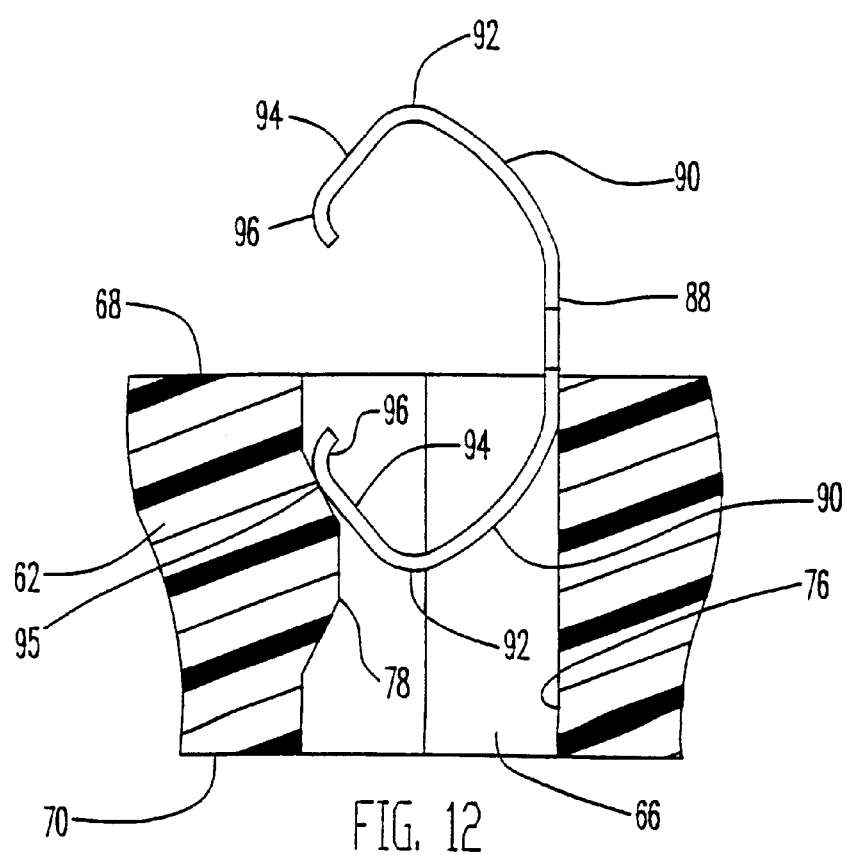
FIG. 12 is a sectional view illustrating insertion of the contact member of FIG. 11 into a passage extending through the plate.

Contacts 64 are inserted into passages 66 as shown in FIG. 12. One nose 92 of the contact is extended into the end of the passage opening at plate top side 68 and is positioned between the projection 78 and wall 76. As the contact is inserted into the passage surface 95 the lower leg 94 serves as a cam follower and is guided by upper cam surface 82 to the end of the projection. Spine 88 slides along wall 76. The upper cam surface 82 extends smoothly from wall 73 so that contact 64 does not bind or catch between projection 78 and wall 73 when leg 94 engages the projection 78.

The contact is then moved further into the passage and the lower spring arm is elastically stressed as lower leg 94 moves past projection 78 and then snaps back under lower cam surface 84. With the contact inserted in passage 66 the spring arms 90 are bowed out from wall 76 with the upper end 96 located above upper cam surface 82 and the lower end 96 located below the lower cam surface 84. The spine 88 of the contact center portion is adjacent the flat wall 76. In this position, the contact 64 is loosely confined within passage 66 with both free ends 96 located within the thickness of the plate 62. Confinement of the free ends within the thickness of the plate assures that, on collapse, the height of the contact is reduced as described without capture of a free end on one side of the plate. Such capture would prevent the contact from forming a reliable electrical connection between opposed pads. The convex side of each free end 96 faces the adjacent cam surface 82 or 84.

If desired, contacts 64 could be inserted into the plate from the bottom side 70 in the same manner as previously described.

Contacts 64 are loosely held in passage 66. Projections 78 extend between contact ends 96. The distance between ends 96 is greater than the height of projections 78 between the ends 96, permitting limited free movement or float of the contacts in passages 66. FIG. 7 illustrates the position of the contact in the passage when plate 62 is horizontal and the loose contact 64 is supported in passage 66 against gravity. The upper curved end 96 of the upper leg 94 rests on the upper cam surface 82 of projection 78 and the lower curved end 96 of the lower leg 94 remains in the passage. Spine 88 engages wall side 76 and maintains the contact in substantially vertical alignment in the passage.

Spine 88 also resists rocking or rotation of the contact in a clockwise or counterclockwise direction as viewed in FIG. 7. Rocking of the contact is also limited by the proximity of the contact ends 96 to side 72 and cam surfaces 82 and 84. The loose confinement of the contact in the passage assures that the contact is in position to be collapsed to form a reliable connection between opposed pads.

Passages 66 are arranged close to each other in a dense array in plate 62 in the same manner as passages 16 are arranged in plate 12.

FIG. 8 illustrates the interposer assembly 60 positioned between upper and lower circuit members 98 and 100 with contact pads 102 and 104 on the members located above and below contacts in the assembly. The contacts lightly engage the pads and are not stressed.

Figure 9:
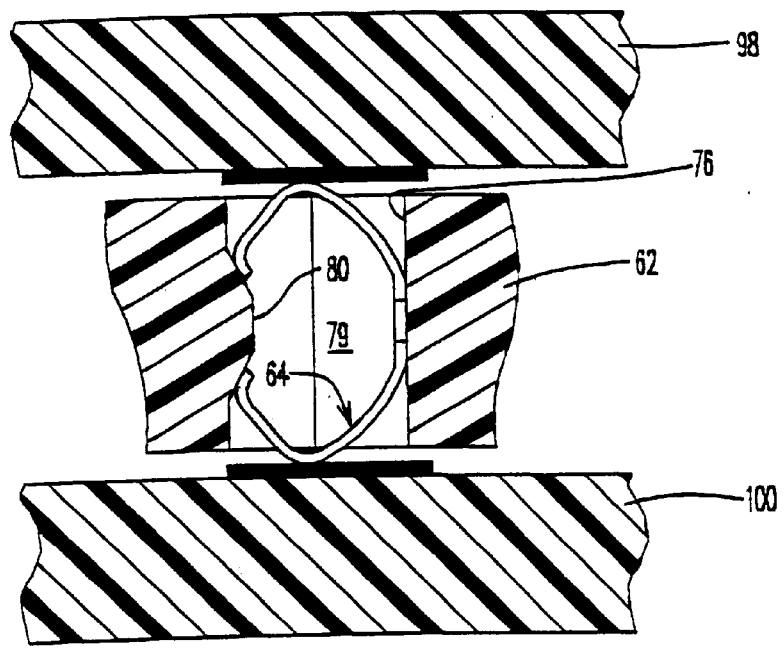
FIG. 9 is a view like FIG. 8 showing the assembly partially sandwiched between the circuit members.
Figure 10:
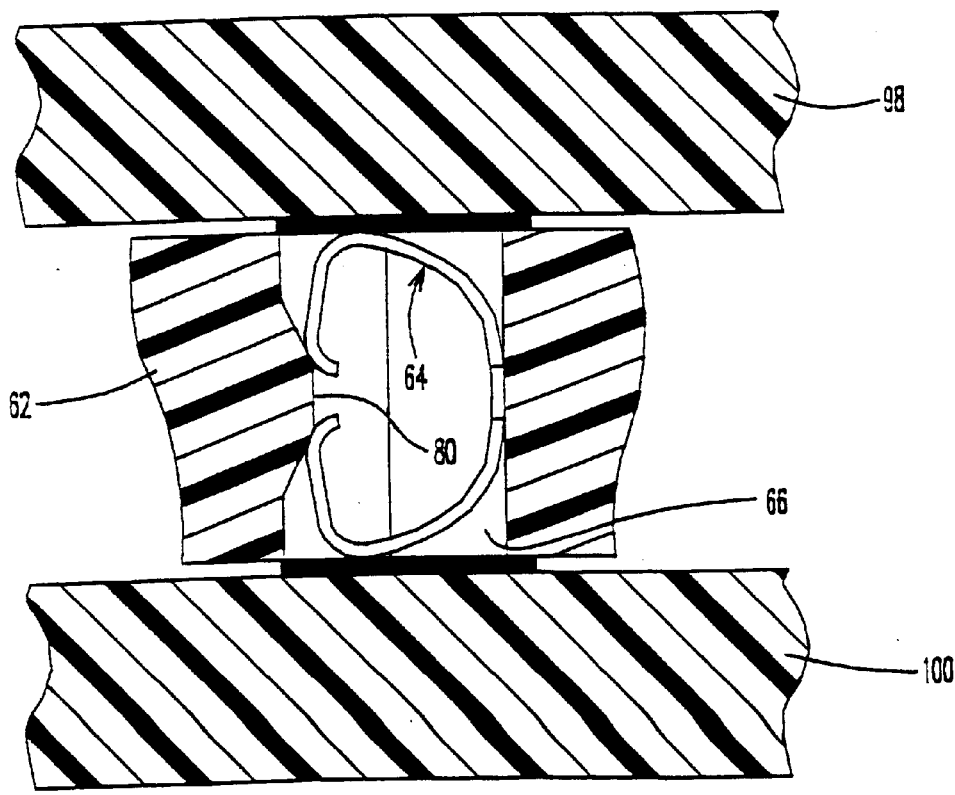
FIG. 10 is a view like FIG. 8 showing the assembly sandwiched between the circuit members.
Figure 11:
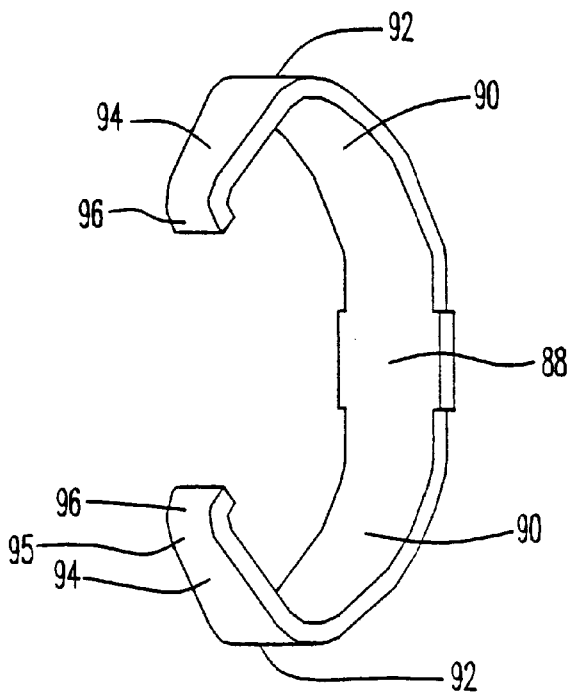
FIG. 11 is a perspective view of the contact shown in the assembly of FIG. 7.

FIG. 9 illustrates the assembly 60 when partially sandwiched between members 98 and 100. When the members are brought toward assembly 60 the two contact pads 102 and 104 are moved together to reduce the height of contacts 64 and elastically bend the two tapered spring arms 90. The curved ends 96 of retention legs 94 move towards each other and towards wall 76. The upper and lower curved ends 96 contact upper and lower cam surfaces 82 and 84 respectively as shown in FIG. 10. After contact, each curved end 96 slides along the cam surface towards projection inner end 80. The curved ends 96 roll slightly on the cam surfaces and maintain tangential engagement with the cam surfaces as the legs slide inwardly toward the free end of the projection. Spine 88 remains flush on wall 76. Contact noses 92 are wiped along the contact pads toward wall 73.

FIG. 10 illustrates the assembly 60 when fully sandwiched between members 98 and 100 with the members held tightly against the assembly plate 62. When the members are brought into contact with the assembly 60 contact pads 102 and 104 reduce the height of contacts 64 to a minimum and further elastically bend spring arms 90. The upper and lower curved ends 96 remain engaged with the cam surfaces near projection inner end 80. The contact spine 88 remains on wall 76. Contact noses 92 have moved further along the contact pads to their position nearest wall 73. The movement or wiping of contact noses 92 along the contact pads make clean, low resistance pressure electrical connections between the contact noses 92 and the pads 102 and 104.

As illustrated in FIG. 10, foreshortening of contact 64 moves the curved end portions 96 of retention legs 94 together and brings the ends into engagement with cam surfaces 82 and 84 of projection 78. Contact pressure is maintained by elastic bending of contact 64 despite engagement of the end portions of the contact with the projection. The slope of the cam surfaces and the curved contact end portions allow the contact to deform without binding on the projection, which could undesirably increase the closing force or permanently deform the contact.

In both embodiments, the projections are located in the center of the contact passages, obstruct the passages and are spaced inwardly from the opposing top and bottom sides of the plate. As illustrated, each passage has a uniform transverse cross section, with the exception of the projections. When each embodiment contact is fully inserted into a passage the cam follower on the contact which engaged the camming surface during insertion faces away from the camming surface on the projection in the passage. Also, in each embodiment the central portion of the metal contact overlies the free end of the projection and the contact free ends are located between the free end of the projection and the side of the passage supporting the projection. Each contact 14 and 64 is symmetrical to either side of the central portion.

While we have illustrated and described preferred embodiments of our invention, it is understood that this is capable of modification, and we therefore do not wish to be limited to the precise details set forth, but desire to avail ourselves of such changes and alterations as fall within the purview of the following claims.

What we claim as our invention:

1. An interposer component adapted to receive a plurality of like metal contacts to form an interposer assembly for establishing electrical connections between pairs of opposed contact pads arranged in a pattern, said interposer component comprising;
    a plate formed from a single piece of insulating material; said plate having a flat top surface, a flat bottom surface extending parallel to the top surface and a uniform thickness;
    a plurality of single contact passages extending through the thickness of the plate from the top surface to the bottom surface thereof, said passages spaced apart from each other and arranged in a pattern corresponding to the pattern of the pairs of spaced contact pad pairs;
    each passage being elongate in transverse cross section and including opposed first and second passage ends, said first passage end being wider than said second passage end and comprising a first end wall, a pair of opposed parallel walls joining the first end wall and extending toward the second end, and a pair of opposed converging walls joining the parallel walls and extending to the second end, said parallel walls defining a uniform width portion of the passage adjacent the first end and said converging walls defining a reduced width portion of the passage adjacent the second end, said walls extending perpendicularly to the top and bottom surfaces of the plate; and
    a plurality of projections integrally formed from the insulating material, each projection located in a passage within the thickness of the plate and extending from the second end a distance into the passage to a projection end, said projection end spaced from said first end wall to define a narrowed passage portion therebetween so that the projection obstructs said passage mediate said top and bottom surfaces, each projection including a first contact camming surface facing the top surface of the plate and sloping from the projection end toward the top surface of the plate and a first contact retention surface facing the bottom surface of the plate, said projection end located between the camming surface and the retention surface.

2. The interposer component as in claim 1 wherein in each cavity the distance between said first and second ends is approximately two times the distance between the parallel walls.

3. The interposer component as in claim 1 wherein each projection is integrally joined to the insulating material in the plate at the second end and at the converging walls of a passage, and each projection end is located in the reduced width portion of the passage and extends across the reduced width portion of the passage between the converging walls.

4. The interposer component as in claim 1 wherein each projection end is located in the center of a passage.

5. The interposer component as in claim 1 wherein said passages and projections are symmetrical to either side of a plane parallel to the top and bottom surfaces and each projection is located equidistant between the top and bottom surfaces.

6. The interposer component as in claim 1 wherein said passages are arranged in spaced perpendicular rows extending along the top and bottom surfaces of the component.

7. The interposer component as in claim 1 wherein each projection end of each projection is located in and extends completely across a reduced width portion of the passage.

8. The interposer component as in claim 7 wherein each projection is located in a reduced width portion of a passage.

9. The interposer component as in claim 1 wherein in each projection, the first retention surface comprises a second camming surface and the first camming surface comprises a second retention surface, wherein contacts may be inserted into the cavities from either the top surface or the bottom surface of the plate.

10. The interposer component as in claim 9 wherein said second camming surface is sloped.

11. The interposer component as in claim 10 wherein each camming surface extends from a second end of a passage to an end of a projection.

12. The interposer component as in claim 11 wherein said camming surfaces each extend at about 25° to the axis of the passage.

13. The interposer component as in claim 6 wherein said camming and retention surfaces are flat.

14. An interposer assembly including the interposer component as in claim 1 and a plurality of metal contacts with a single contact disposed in each said passage in the interposer component between the parallel walls and the converging walls;
    each of said metal contacts comprising a central portion, a pair of flexible spring members joining the central portion and having outer ends, a pair of contact noses located on the outer ends of the spring members, a pair of retention legs extending inwardly from the outer ends toward a projection, and a cam follower on one leg and facing away from the contact camming surface on the projection in the passage in which the contact is disposed, the projection in each passage located between the legs of the contact in the passage, said central portion engaging the first end wall, said contact noses normally being spaced apart a distance greater than the thickness of the plate; and wherein upon insertion of said contacts into said passages towards said camming surfaces the cam followers engage the cam surfaces, are cammed past the projections and snap back behind the projections.

15. The interposer assembly as in claim 14 wherein each metallic contact includes a flat spine, each spine located within the thickness of the plate and engaging a first end wall.

16. The interposer assembly as in claim 14 wherein said contacts are formed from sheet metal stock and each spring member comprises a bowed, tapered arm.

17. The interposer assembly as in claim 16 including a rounded end on each retention leg, and wherein the rounded ends of the retention legs of each contact are spaced apart a distance greater than the height of the projection located between the retention legs when the contact is unstressed.

18. The interposer assembly as in claim 14 wherein each projection end is located in the center of a passage and each metal contact is symmetrical to either side of the central portion thereof.

19. The interposer assembly as in claim 18 wherein said passages and projections are symmetrical to either side of a plane parallel to the top and bottom surfaces, said plane located equidistant between the top and bottom surfaces.

20. The interposer assembly as in claim 19 wherein each projection includes a second contact camming surface facing the bottom surface.

21. The interposer assembly as in claim 20 wherein said first and second contact camming surfaces are flat.

22. An interposer component adapted to receive a plurality of like metal contacts to form an interposer assembly for establishing electrical connections between pairs of opposed contact pads arranged in a pattern, said interposer component comprising;

a plate formed from a single piece of insulating material;

said plate having a flat top surface, a flat bottom surface extending parallel to the top surface and a uniform thickness;

a plurality of single contact passages extending through the thickness of the plate from the top surface to the bottom surface thereof, said passages spaced apart from each other and arranged in a pattern corresponding to the pattern of the pairs of spaced contact pad pairs;

each passage having a number of interior walls extending from the top surface to the bottom surface of the plate, the walls including first and second opposed end walls, a pair of spaced walls joining said first end wall and said second end wall, said second end wall being narrower than said first end wall, the distance between said spaced walls adjacent the first end wall being less than the distance between said end walls, said spaced walls defining a wide portion of the passage adjacent the first end wall and a narrow portion of the passage adjacent the second end wall; and a plurality of projections integrally formed from the insulating material, each projection located within the thickness of the plate in a passage adjacent the second end wall thereof and integrally joined to the insulating material at the second end wall and to the insulating material in the spaced walls adjacent the second end wall, each projection including a projection end extending across the passage between the spaced walls and facing the first end wall to obstruct the passage mediate said top and bottom surfaces, each projection further including a first contact camming surface facing the top surface of the plate and sloping from the end of the projection toward the top surface of the plate and a first contact retention surface facing the bottom surface of the plate and extending from the end of the projection toward the second end wall.

23. The interposer component as in claim 22 wherein in each projection the first retention surface comprises a second camming surface and the first camming surface comprises a second retention surface wherein contacts may be inserted into the passages from either the top or the bottom surface of the plate.

24. The interposer component as in claim 22 wherein in each passage the distance between the first and second end walls is approximately twice the distance between the spaced walls adjacent the first end wall.

25. The interposer component as in claim 22 wherein each projection is located in a narrow portion of a passage.

26. An interposer component adapted to receive a plurality of like metal contacts to form an interposer assembly for establishing electrical connections between pairs of opposed contact pads arranged in a pattern, the interposer component comprising:

a plate formed from a single body of insulating material;

said plate having a flat top surface, a flat bottom surface parallel to the top surface and uniform thickness;

a plurality of single contact passages extending through the thickness of the plate from the top surface to the bottom surface thereof, said passages spaced apart from each other and arranged in a pattern corresponding to the pattern of the pairs of spaced contact pads;

the interior of each said passage having a first end and a second end spaced across the passage from the first end, said first end being wider than said second end, and opposed walls extending between said ends, said ends and walls extending between said top and bottom surfaces; and a plurality of projections formed from the insulating material, each projection located within the thickness of the plate at the second end of a passage between the top surface and the bottom surface of the plate and extending across the passage toward the first end thereof to a projection end obstructing the passage mediate said top and bottom surfaces, each projection further including a first contact camming surface facing the top surface of the plate and sloping from the end of the projection toward the top surface of the plate and a first contact retention surface facing the bottom surface of the plate.

27. The interposer component as in claim 26 wherein in each projection the first retention surface comprises a second camming surface and the first camming surface comprises a second retention surface wherein contacts may be inserted into the passages from either the top or the bottom surface of the plate.

28. The interposer component as in claim 26 wherein said passages and projections are symmetrical to either side of a plane parallel to the top and bottom surfaces and located between the top and bottom surfaces.

29. The interposer component as in claim 28 wherein said plane is located equidistant between the top and bottom surfaces.

30. An interposer assembly including the interposer component as in claim 26 and a plurality of like metal contacts, each such contact disposed in one of said passages in the interposer component and including contact members normally spaced apart a distance greater than the thickness of the plate.

31. The interposer assembly as in claim 30 wherein each contact includes a flat spine located within the thickness of the plate such spine engaging the first end of the passage.

32. The interposer assembly as in claim 30 wherein each of said metal contacts comprises a central portion and is symmetrical to either side of the central portion.

33. The interposer assembly as in claim 32 wherein each of said metal contacts includes a pair of flexible spring arms joining the central portion and having outer ends with contact noses located on the outer ends, a pair of retention legs extending inwardly from the outer ends toward a passage projection, and a cam follower on one leg, said cam follower facing away from the contact camming surface in such projection, such projection located between the legs of the contact in the passage.

34. The interposer assembly as in claim 32 wherein the central portion of each contact is located adjacent the first end of the passage in which the contact is disposed, each contact includes two spaced apart end portions, and the projection in such passage is located between the contact end portions.

35. The interposer assembly as in claim 34 wherein in each contact the central portion is wider than each end portion.

* * * * *

UNITED STATES PATENT AND TRADEMARK OFFICE
CERTIFICATE OF CORRECTION

PATENT NO.    : 6,176,707 B1
DATED         : January 23, 2001
INVENTOR(S)   : Neidich et al.

It is certified that error appears in the above-identified patent and that said Letters Patent is hereby corrected as shown below:

<u>Column 8,</u>
Line 20, delete "cavity" and substitute -- passage -- therefor.
Line 41, following "across" delete "a" and substitute -- the -- therefor.
Line 58, delete "6" and substitute -- 11 -- therefor.

Signed and Sealed this

Twenty-sixth Day of March, 2002

*Attest:*

*Attesting Officer*

JAMES E. ROGAN
*Director of the United States Patent and Trademark Office*